United States Patent
Kudo

(10) Patent No.: US 7,015,981 B2
(45) Date of Patent: Mar. 21, 2006

(54) TELEVISION SIGNAL TRANSMITTER CAPABLE OF ELIMINATING OCCURRENCE OF ADVERSE INFLUENCES CAUSED BY INTERFERENCE SIGNALS

(75) Inventor: Yasuharu Kudo, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 563 days.

(21) Appl. No.: 10/354,611

(22) Filed: Jan. 30, 2003

(65) Prior Publication Data

US 2003/0147014 A1    Aug. 7, 2003

(30) Foreign Application Priority Data

Feb. 6, 2002    (JP)    ............................. 2002-029264

(51) Int. Cl.
H04N 5/38    (2006.01)
(52) U.S. Cl. ........................ 348/723; 348/21; 348/470; 348/608
(58) Field of Classification Search ................ 348/723, 348/724, 470, 21, 608; 725/118, 148; 332/159, 332/161; 375/295; 455/114.2, 296, 307–311
See application file for complete search history.

(56) References Cited

U.S. PATENT DOCUMENTS

| | | | | |
|---|---|---|---|---|
| 4,622,694 A | * | 11/1986 | Weber et al. | 455/47 |
| 6,377,314 B1 | * | 4/2002 | Collins et al. | 348/723 |
| 6,411,342 B1 | * | 6/2002 | Tatsuta | 348/724 |
| 6,724,441 B1 | * | 4/2004 | Choi | 348/731 |

FOREIGN PATENT DOCUMENTS

JP    2001-111903    4/2001

* cited by examiner

Primary Examiner—Victor R. Kostak
(74) Attorney, Agent, or Firm—Brinks Hofer Gilson & Lione

(57) ABSTRACT

A television signal transmitter is arranged by a first frequency converter for up-converting an input signal into an intermediate frequency signal, and a second frequency converter for down-converting the intermediate frequency signal into a television signal of any of channels within a predetermined output frequency band. In this television transmitter, a picture intermediate frequency of the intermediate frequency signal is set to be higher than a maximum frequency of the output frequency band, and is set to be lower than a doubled picture frequency of any one of the channels within the output frequency band by 1.25 MHz.

2 Claims, 2 Drawing Sheets

TELEVISION SIGNAL TRANSMITTER CAPABLE OF ELIMINATING OCCURRENCE OF ADVERSE INFLUENCES CAUSED BY INTERFERENCE SIGNALS

BACKGROUND OF THE INVENTION

1. Field of the Invention

The present invention is related to a television signal transmitter for converting a television intermediate frequency signal into a television signal to be transmitted.

2. Description of the Related Art

FIG. 4 schematically shows an arrangement of a conventional television signal transmitter. An input signal of a television signal transmitter is entered via a band-pass filter 11 to a first mixer 12a. As to this input signal, a picture intermediate frequency is selected to be 45.75 MHz and a sound intermediate frequency is selected to be 41.25 MHz in the US television technical specification. The first mixer 12a constitutes a first frequency converter 12 in combination with a first local oscillator 12b. Then, a first local-oscillator signal having a frequency of 1065 MHz is entered from the first local oscillator 12b into the first mixer 12a. The first mixer 12a mixes the input signal with the first local-oscillator signal so as to produce an intermediate frequency signal base upon a summation of the frequencies of these signals (namely, picture intermediate frequency is 1110.75 MHz, and sound intermediate frequency is 1106.25 MHz).

The intermediate frequency signal is entered via a band-pass filter 13 to a second mixer 14a. The second mixer 14a constitutes a second frequency converter 14 in combination with a second local oscillator 14b. Then, a second local-oscillator signal outputted from the second local oscillator 14b is inputted to the second mixer 14a. The frequency of this second local-oscillator signal is changed from approximately 1160.75 MHz up to approximately 2110.75 MHz. As a result, in the second mixer 14a, the intermediate frequency signal is mixed with the second local-oscillator signal, so that such a television signal is outputted in any one of channels covered within a predetermined output frequency band defined from 50 MHz up to 1000 MHz, corresponding to a difference between the frequency of the intermediate frequency signal and the frequency of the second local-oscillator signal.

This television signal is transferred via a band-pass filter 15 to a cable of a CATV system. A passband of this band-pass filter 15 is selected to be 50 MHz up to 1000 MHz.

The intermediate frequency signal outputted from the first mixer 12a is entered via the band-pass filter 13 to the second mixer 14a. Since the frequency of this intermediate frequency signal is high, harmonics of the intermediate frequency signal cannot be sufficiently attenuated. As a result, when the harmonics of the intermediate frequency signal are entered into the second mixer 14a, interference signals are generated from the second mixer 14a. Among these interference signals, double higher harmonics are most typically produced from the second mixer 14a. When the output frequency becomes nearly equal to a half of the frequency of the intermediate frequency signal, the interference signals are generated within the frequency band of this channel, which will be described in detail.

Assuming now that the picture intermediate frequency is defined as "FI", and also the frequency of the second local-oscillator signal is defined as "FL", an output frequency "FO" of a desirable television signal outputted from the second mixer 14a is expressed by the following formula (1):

$$FO = FL - FI \qquad (1).$$

Also, a frequency "FU", of an interference signal outputted from the second mixer 14a is expressed by the below-mentioned formula (2):

$$FU = 2FI - FL \qquad (2).$$

In this case, since interference may occur when the output frequency "FO" of the television signal in the formula (1) becomes equal to the frequency "FU" of the interference signal in the formula (2), if this condition is acquired, then the following formula (3) is given:

$$FU = FI - FO \qquad (3).$$

That is to say, the frequency "FU" of the interference signal may be defined as such a frequency obtained by subtracting the output frequency "FO" from the picture interference frequency "FI." As a consequence, when the output frequency "FO" becomes near equal to ½ of the picture intermediate frequency "FI", the interference signal may be produced within the band of this channel. Since the frequency "FU" of this interference signal is generated within the output frequency band, this interference signal cannot be removed by the band-pass filter 15 which is provided on the output side of the second mixer 14a.

For instance, when the picture intermediate frequency "FI" is equal to 1110.75 MHz, the interference signal having the frequency "FU" is generated at such a frequency nearly equal to ½ of this picture intermediate frequency "FI", namely approximately 555 MHz. In an actual case, as indicated in FIG. 3, since the picture carrier frequency of the TV channel "CH.79" is located at the frequency of 553.25 MHz in the US television technical specification, the interference signal having the frequency "FU" is produced at a frequency of 557.5 MHz calculated from the above-described formula (3). This frequency of the interference signal corresponds to an upper-sided frequency of the picture carrier frequency of the channel CH.79, and also corresponds to such a frequency within the frequency band of this TV channel. As a consequence, when the TV signal of this channel "CH.79" is received, adverse influences caused by the interference signal having the frequency "FU" may appear.

On the other hand, since the frequency "FU" of the interference signal becomes nearly equal to ½ of the picture intermediate frequency "FI", the frequency of the intermediate frequency signal may be increased to be set to two times, or more higher than the frequency of the television signal of the maximum output channel (namely, highest frequency of output frequency band). However, increasing the frequency of such an intermediate frequency signal could not provide the best solution as to the interference signal in view of circuit loss and the like.

SUMMARY OF THE INVENTION

An object of the present invention is to provide a television signal transmitter operable in such a manner that when a television signal outputted from the television signal transmitter is received, an adverse influence does not appear which is caused by the above-described interference signal produced based upon the double higher harmonics of the intermediate frequency signal.

To solve the above-explained problem, a television signal transmitter, according to an aspect of the present invention, is featured by comprising: a first frequency converter for up-converting an input signal into an intermediate frequency signal; and a second frequency converter for down-converting the intermediate frequency signal into a television signal of any of channels within a predetermined output frequency band; in which a picture intermediate frequency of the intermediate frequency signal is set to be higher than a maximum frequency of the output frequency band, and is set to be lower than a doubled picture frequency of any one of the channels within the output frequency band by 1.25 MHz.

Also, in this television signal transmitter, the output frequency band is defined from 50 MHz up to 1000 MHz, and the picture intermediate frequency is set to 1117.25 MHz.

BRIEF DESCRIPTION OF THE DRAWINGS

For a better understanding of the present invention, reference is made of a detailed description to be read in conjunction with the accompanying drawings, in which.

DETAILED DESCRIPTION OF THE PREFERRED EMBODIMENTS

Figure 1:
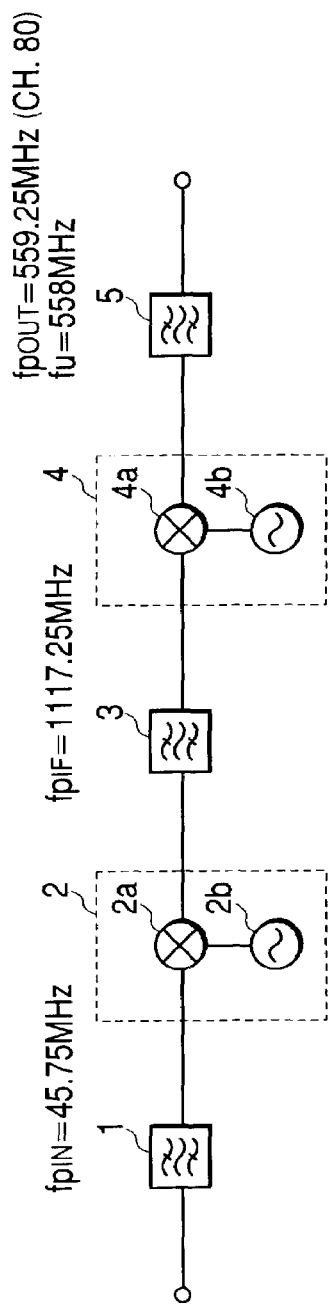
FIG. 1 is a circuit diagram for indicating an arrangement of a television signal transmitter according to an embodiment of the present invention.
Figure 2:
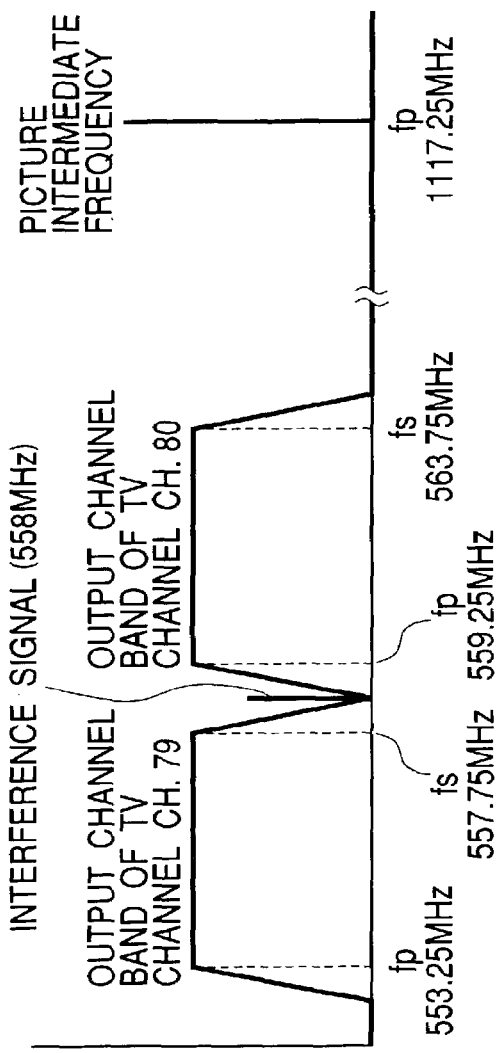
FIG. 2 is a diagram for illustratively showing a relationship between an output channel band and an interference signal in the television signal transmitter of the embodiment of the present invention.

FIG. 1 is a circuit diagram for indicating an arrangement of a television signal transmitter according to an embodiment of the present invention. An input signal of a television signal transmitter is entered via an input band-pass filter 1 to a first mixer 2a. As to this input signal, a picture intermediate frequency is selected to be 45.75 MHz and a sound intermediate frequency is selected to be 41.25 MHz in the US television technical specification. The first mixer 2a constitutes a first frequency converter 2 in combination with a first local oscillator 2b.

Then, a first local-oscillator signal outputted from the first local oscillator 2b is entered into the first mixer 2a. The first mixer 2a mixes the input signal with the first local-oscillator signal so as to produce an intermediate signal base upon a summation of the frequencies of these signals.

The intermediate frequency signal is entered via an intermediate frequency band-pass filter 3 to a second mixer 4a. The second mixer 4a constitutes a second frequency converter 4 in combination with a second local oscillator 4b. Then, a second local-oscillator signal outputted from the second local oscillator 4b is inputted to the second mixer 4a. In the second mixer 4a, the intermediate frequency signal is mixed with the second local-oscillator signal, so that such a television signal to be transmitted is produced having a frequency corresponding to a difference between the frequency of the intermediate signal and the frequency of the second local-oscillator signal. This television signal may constitute a television signal of any one of TV channels covered within a predetermined output frequency band between 50 MHz and 1000 MHz.

In other words, the television signal outputted from the second mixer 4a is transferred via an output band-pass filter 5 to a cable of CATV system. A passband of this output band-pass filter 5 is selected to be 50 MHz up to 1000 MHz.

within the above-described circuit arrangement, assuming now that the picture intermediate frequency of the intermediate frequency signal is defined as "FI", and also the frequency of the second local-oscillator signal is defined as "FL", as explained above, a picture frequency "FO" of a television signal outputted from the second mixer 4a is expressed by the following formula (1):

$$FO = FL - FI \qquad (1).$$

On the other hand, as described above, a frequency "FU" of an interference signal outputted from the second mixer 4a is expressed by the below-mentioned formula (3):

$$FU = FI - FO \qquad (3).$$

In this case, assuming now that a picture frequency of an output signal when the interference signal is generated within this frequency band is defined as "FO", as expressed in the below-mentioned formula (4), the frequency "FU" of the interference signal is set to such a frequency lower than the picture frequency "FO" of the output signal by 1.25 MHz:

$$FU = FO - 1.25 \qquad (4).$$

In the case that the frequency "FU" of the interference signal of the formula (3) is made equal to the frequency "FU" of the interference signal of the formula (4), the picture intermediate frequency "FI" of the intermediate frequency signal is expressed by the following formula (5):

$$FI = 2FO - 1.25 \qquad (5).$$

Then, in such a case that the picture frequency "FO" of the output signal is selected to be, for instance, 559.25 MHz (namely, channel CH.80 in US television technical specification) at this time, the picture intermediate frequency "FI" of the intermediate frequency signal becomes 1117 MHz according to the formula (5).

In other words, if the picture intermediate frequency "FI" of the intermediate frequency signal is set to 1117.25 MHz, then an interference signal may appear at such a frequency (558 MHz) when a television signal is transmitted in the TV channel CH.80 of the US television technical specification. This frequency of the interference signal is lower than the picture frequency of this TV channel CH.80 by 1.25 MHz.

Figure 3:
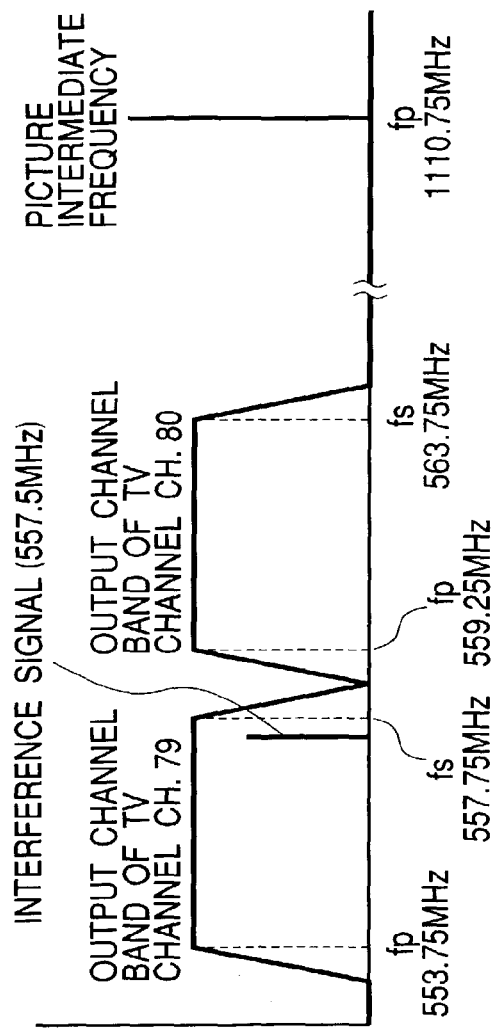
FIG. 3 is a diagram for illustratively representing the relationship between the output channel band and the interference signal in the conventional television signal transmitter.
Figure 4:
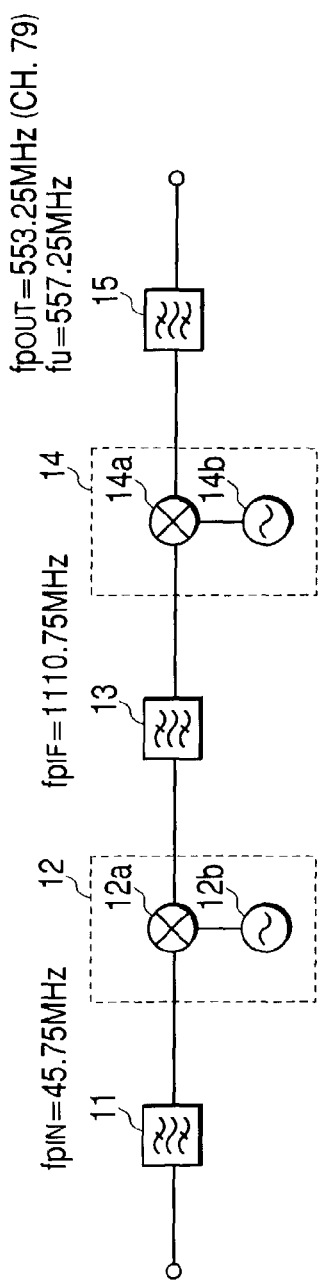
FIG. 4 is a circuit diagram for indicating the arrangement of the conventional television signal transmitter.

As indicated in FIG. 3, this frequency (558 MHz) which is lower than the picture frequency of the TV channel CH.80 by 1.25 MHz corresponds to a frequency at a boundary between the TV channel CH.79 and the TV channel CH.80 in the US television technical specification. This frequency is such a frequency which may be attenuated by employing a SAW filter and the like in a television signal receiving apparatus (not shown) used to receive the output signal of the television signal transmitter, and also corresponds to a frequency which does not give an adverse influence when the actual television signals are received. In other words, this frequency (558 MHz) of the interference signal corresponds to such a signal similar to frequencies out of a frequency band of a reception channel.

Also, during signal receptions of any TV channels other than the TV channel CH.80 (US television technical specification) in the case that the frequency "FU" of the interference signal is set as explained above, for instance, during the signal reception of the TV channel CH.79 (namely, frequency lower than that of TV channel CH.80 by 6 MHz), the frequency "FL" of the second local-oscillator signal becomes lower than that when the TV channel CH.80 is received by 6 MHz in the above-described formula (5). As a consequence, the frequency of the interference signal during the signal reception of the TV channel CH.79 becomes higher than that during the signal reception of the TV channel CH.80 by 6 MHz. Also, since the reception frequency itself of the TV channel CH.79 is lower than that during the signal reception of the TV channel CH.80 by 6 MHz, a frequency difference between the frequency of the interference signal and the picture frequency of the TV channel CH.79 becomes higher than that during the signal reception of the TV channel CH.80 by 12 MHz, resulting in no specific problem.

This fact may be similarly applied to other reception channels. The further a reception TV channel is separated from the TV channel CH.80, the larger the frequency difference between the frequency of the interference signal and the picture frequency of this reception TV channel becomes, so that no specific problem occurs.

It should be understood that in the above-described embodiment, the frequency of the interference signal has been set to such a frequency lower than the picture frequency of the TV channel CH.80 by 1.25 MHz. Alternatively, as apparent from the foregoing description, a similar effect may be achieved also in such a case that the frequency of the interference signal may appear at a frequency lower than not only the above-described picture frequency of the reception channel CH.80, but also a picture frequency of another reception channel by 1.25 MHz.

As previously described, in accordance with the present invention, the television signal transmitter is arranged by comprising: the first frequency converter for up-converting the input signal into the intermediate frequency signal; and the second frequency converter for down-converting the intermediate frequency signal into the television signal of any of the channels within a predetermined output frequency band; in which the picture intermediate frequency of the intermediate frequency signal is set to be higher than the maximum frequency of the output frequency band, and is set to be lower than the doubled picture frequency of any one of the channels within the output frequency band by 1.25 MHz. As a result, while the frequency of the intermediate frequency signal is not increased, the adverse influences of the interference signal caused by the double high harmonics of the intermediate frequency signal can be eliminated in all of the channels.

Also, in the television signal transmitter, the output frequency band is defined from 50 MHz up to 1000 MHz, and the picture intermediate frequency of the intermediate frequency signal is set to 1117.25 MHz. When the TV channel CH.80 (defined in US television technical specification) is received, the frequency of the interference signal is set to such a frequency at the boundary between the TV channels CH.79 and CH.80, and the frequency of the interference signal is set to be similar to a frequency out of the frequency band. As a consequence, the adverse influences caused by the interference signal can be eliminated in any channels other than the TV channels CH.79 and CH.80, and furthermore, even in either the TV channel CH.80 or the TV channel CH.79, which are located very close to the interference signal.

What is claimed is:

1. A television signal transmitter comprising:
    a first frequency converter for up-converting an input signal into an intermediate frequency signal; and
    a second frequency converter for down-converting said intermediate frequency signal into a television signal of any of channels within a predetermined output frequency band;
wherein:
    a picture intermediate frequency of said intermediate frequency signal is set to be higher than a maximum frequency of said output frequency band, and is set to be lower than a doubled picture frequency of any one of said channels within said output frequency band by 1.25 MHz.

2. A television signal transmitter as claimed in claim 1 wherein:
    said output frequency band is defined from 50 MHz up to 1000 MHz, and said picture intermediate frequency is set to 1117.25 MHz.

* * * * *